United States Patent
Beier

(10) Patent No.: US 8,027,139 B2
(45) Date of Patent: Sep. 27, 2011

(54) SYSTEM AND METHOD FOR SUPERCONDUCTING MAGNET RAMP-DOWN

(75) Inventor: James G. Beier, Florence, SC (US)

(73) Assignee: General Electric Company, Schenectady, NY (US)

( * ) Notice: Subject to any disclaimer, the term of this patent is extended or adjusted under 35 U.S.C. 154(b) by 379 days.

(21) Appl. No.: 12/463,453

(22) Filed: May 11, 2009

(65) Prior Publication Data

US 2010/0284120 A1    Nov. 11, 2010

(51) Int. Cl.
*H02H 7/00* (2006.01)
(52) U.S. Cl. .......................................... 361/141; 361/19
(58) Field of Classification Search .................... 361/19, 361/141; 335/216
See application file for complete search history.

(56) References Cited

U.S. PATENT DOCUMENTS

| | | | |
|---|---|---|---|
| 4,816,962 A * | 3/1989 | Yamada et al. ............... 361/141 |
| 5,432,669 A * | 7/1995 | Nemoto et al. ............... 361/143 |
| 5,570,022 A | 10/1996 | Ehnholm et al. |
| 7,157,999 B2 * | 1/2007 | Kasten ......................... 335/216 |
| 7,298,602 B2 | 11/2007 | Knight |
| 2008/0049371 A1 * | 2/2008 | Mallett ........................ 361/141 |

* cited by examiner

*Primary Examiner* — Danny Nguyen
(74) *Attorney, Agent, or Firm* — Ziolkowski Patent Solutions Group, SC

(57) ABSTRACT

A system for ramping-down a superconducting magnet includes an electrically conductive lead connectable to a superconducting magnet and a plurality of diode assemblies arranged in series and coupled to the electrically conductive lead. Switches are arranged in parallel with the plurality of diode assemblies, with each switch having a first position and a second position and wherein each switch, when in the first position, forms an electrical short between first and second nodes of a corresponding diode assembly. A controller receives a magnet parameter value indicative of a present state of the superconducting magnet, determines a number of diode assemblies through which current from the electrically conductive lead is desired to pass based on the magnet parameter value, and selectively actuates the switches coupled to the determined number of diode assemblies to the second position to pass current from the superconducting magnet through the determined number of diode assemblies.

21 Claims, 3 Drawing Sheets

SYSTEM AND METHOD FOR SUPERCONDUCTING MAGNET RAMP-DOWN

BACKGROUND OF THE INVENTION

Embodiments of the invention relate generally to medical imaging devices and other systems employing superconducting magnet systems and, more particularly, to a system and method for ramping-down a superconducting magnet in an automated fashion for servicing.

As is known, a coil wound of superconductive material (a magnet coil) can be made superconducting by placing it in an extremely cold environment, (e.g., −269° C. or 4 K). For example, a coil may be made superconducting by enclosing it in a cryostat or pressure vessel containing a cryogen. The extreme cold enables the coil wires to be operated in a superconducting state. In this state, the resistance of the wires is practically zero. To introduce a current flow through the coils, a power source is initially connected to the coils for a short time period. In the superconducting state, the current will continue to flow through the coils, thereby maintaining a strong magnetic field. In other words, because superconductive windings offer little to no resistance to electrical current flow at low temperatures, the superconducting state of the magnet is persistent. The electric current that flows through the superconducting magnet is maintained within the magnet and does not decay noticeably with time.

Superconducting magnets have wide applications in the field of magnetic resonance imaging ("MRI"). In a typical MRI magnet, the main superconducting magnet coils are enclosed in a cylindrically shaped cryogen pressure vessel containing a cryogen, such as liquid helium. The cryogen vessel is contained within an evacuated vessel and formed with an imaging bore in the center. The main magnet coils develop a strong magnetic field in the imaging volume of the axial bore that, when combined with controlled gradient magnetic fields and RF pulses, act to generate a signal from a patient may be received and processed to form an image. In existing MRI systems, a main magnetic field of 3 Tesla may be desired to produce vivid images.

Occasionally, it may be desirable or necessary to de-energize the superconducting magnet. For example, when components of the cryogenic cooling system degrade, when leaks within the cryogen (helium) vessel are found, or when other maintenance on the MRI system is desired, it may be necessary to de-energize the magnet system. Deactivation may require a "ramp-down" of the magnet, where current must be slowly lowered in the magnet to weaken the magnet field strength. These ramp-downs are often manually intensive, time consuming, and expensive. Typically, it can take 34 hours to de-energize a 3.0 T magnet using conventional techniques, during which time a magnet engineer must be present to oversee the ramp-down procedure. Furthermore, as external leads are connected to the magnet during the ramp-down, heat is added to the magnet thereby causing an increased rate of boil-off of the liquid helium as it boils into helium gas. The helium gas may be vented to the atmosphere, which can add significant costs to the ramp-down operation since the vented helium gas may not be recoverable from the atmosphere for conversion back into a liquid. Accordingly, a portion of the cryogen may need to be replaced.

Additionally, the ramp-down of the magnet may, if performed improperly, cause damage to the magnet system. For example, if current in the magnet is ramped down too quickly, a phenomenon of "quenching" may occur, in which a localized portion of the magnet increases in temperature and loses superconductivity. This localized increase in temperature can burn or damage the superconducting coils of the magnet. In addition, the rapid decrease in the molecular density within the cryogen vessel resulting from a sharp temperature rise sharply reduces the insulating ability normally provided by the helium gas resulting in possible voltage breakdown through the gas which can seriously damage the various coils and associated control circuitry of the elements within the cryogen vessel.

Thus, for the aforementioned reasons, a field engineer may typically be generous in the amount of time used to ramp-down the magnet current. Unfortunately, however, a conservative ramp-down results in longer ramp times, increased downtime, increased maintenance costs, and so forth. Thus, conservative magnet ramp-down techniques may increase the cost of operating and maintaining an MRI system and may decrease the availability of the MRI system.

It would therefore be desirable to have a system and method capable of reducing MRI periods of deactivation, costs, and so forth. Particularly, there is a need to reduce the ramp-down time of the superconducting magnet while maintaining equipment integrity and while reducing helium loss, equipment downtime, and maintenance costs.

BRIEF DESCRIPTION OF THE INVENTION

Embodiments of the invention provide a system and method of ramping-down a superconducting magnet in an automated fashion for servicing.

In accordance with one aspect of the invention, a superconducting magnet ramp-down unit includes an electrically conductive lead connectable to a superconducting magnet and a plurality of diode assemblies arranged in series and coupled to the electrically conductive lead, each diode assembly having a first node and a second node. The ramp-down unit also includes a plurality of switches arranged in parallel with the plurality of diode assemblies, with each switch having a first position and a second position and wherein each switch, when in the first position, forms an electrical short between the first and second nodes of a corresponding diode assembly. The ramp-down unit further includes a controller programmed to receive at least one magnet parameter value indicative of a present state of the superconducting magnet, determine a number of the plurality of diode assemblies through which current from the electrically conductive lead is desired to pass based on the at least one magnet parameter value, and selectively actuate the plurality of switches respectively coupled to the determined number of diode assemblies to the second position, such that the current from the superconducting magnet passes through the determined number of diode assemblies.

In accordance with another aspect of the invention, a method for automatically controlling a ramp-down of a superconducting magnet includes the step of electrically coupling a ramp-down unit to the superconducting magnet, with the ramp down unit comprising a plurality of diode assemblies and a plurality of solenoid switches arranged in parallel with the plurality of diode assemblies. The method also includes the steps of monitoring at least one magnet parameter value indicative of a current state of the superconducting magnet and determining a number of the plurality of diode assemblies through which current from the superconducting magnet is desired to pass based on the at least one magnet parameter value. The method further includes the step of selectively actuating the plurality of solenoid switches respectively coupled to the determined number of diode assemblies from a closed position to an open position based on the at least one magnet parameter value, wherein the selective actuation of the plurality of solenoid switches respectively coupled to the determined number of diode assemblies from the closed position to the open position causes current from the superconducting magnet to pass through the determined number of diode assemblies.

In accordance with yet another aspect of the invention, a system for automatically ramping-down a superconducting magnet includes an electrically conductive lead connectable to a superconducting magnet, a plurality of diode assemblies arranged in series and coupled to the electrically conductive lead, and a plurality of switches arranged in parallel with the plurality of diode assemblies, with each switch having a first position and a second position and wherein each switch causes current from the superconducting magnet to bypass a corresponding diode assembly when in the first position and causes current from the superconducting magnet to pass through a corresponding diode assembly when in the second position. The system also includes a controller programmed to receive at least one magnet parameter value indicative of a present state of the superconducting magnet and determine if the superconducting magnet is in a controlled ramp down range or in an uncontrolled ramp down range based on the at least one magnet parameter value. The controller is further programmed to selectively actuate a portion of the plurality of switches from the first position to the second position if the superconducting magnet is in the controlled ramp down range and actuate each of the plurality of switches from the first position to the second position if the superconducting magnet is in the uncontrolled ramp down range.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Embodiments of the present invention relate to management of superconductive magnets, and particularly to the de-energizing or ramping-down of such systems. Although reference is made throughout the following discussion to medical imaging systems, it is recognized that embodiments of the invention are applicable to a range of systems or devices that utilize superconducting magnets, such as spectroscopy systems and the like.

Figure 1:
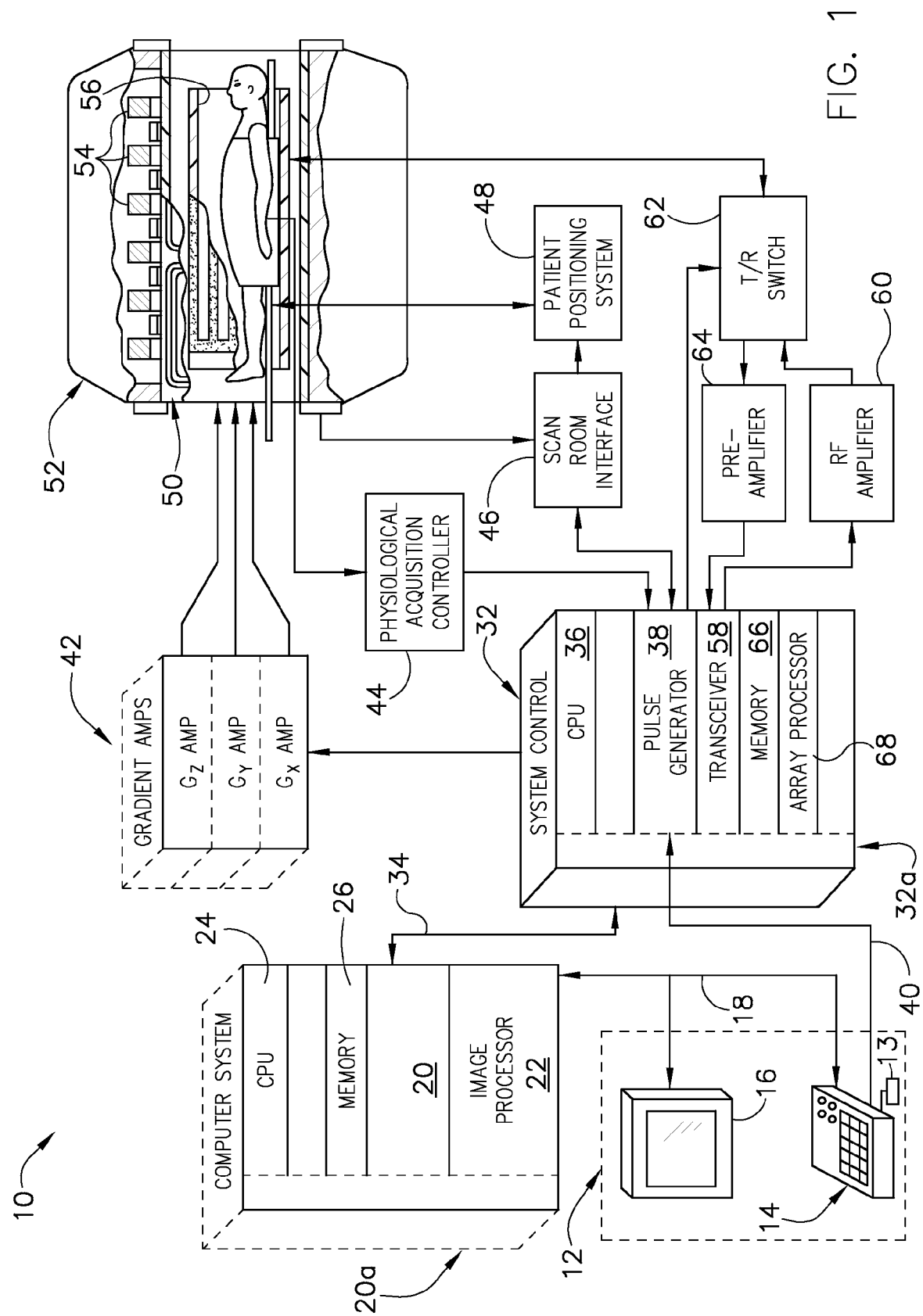
FIG. 1 is a schematic block diagram of an exemplary MR imaging system for use with an embodiment of the invention.

Referring to FIG. 1, the major components of a magnetic resonance imaging (MRI) system 10 are shown for use with embodiments of the invention. The operation of the MRI system 10 is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, which may include a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. The polarizing magnet 54 is configured and operated as a superconducting magnet (i.e., kept at a superconducting temperature) to generate a main magnetic field of, for example, 3 Tesla. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
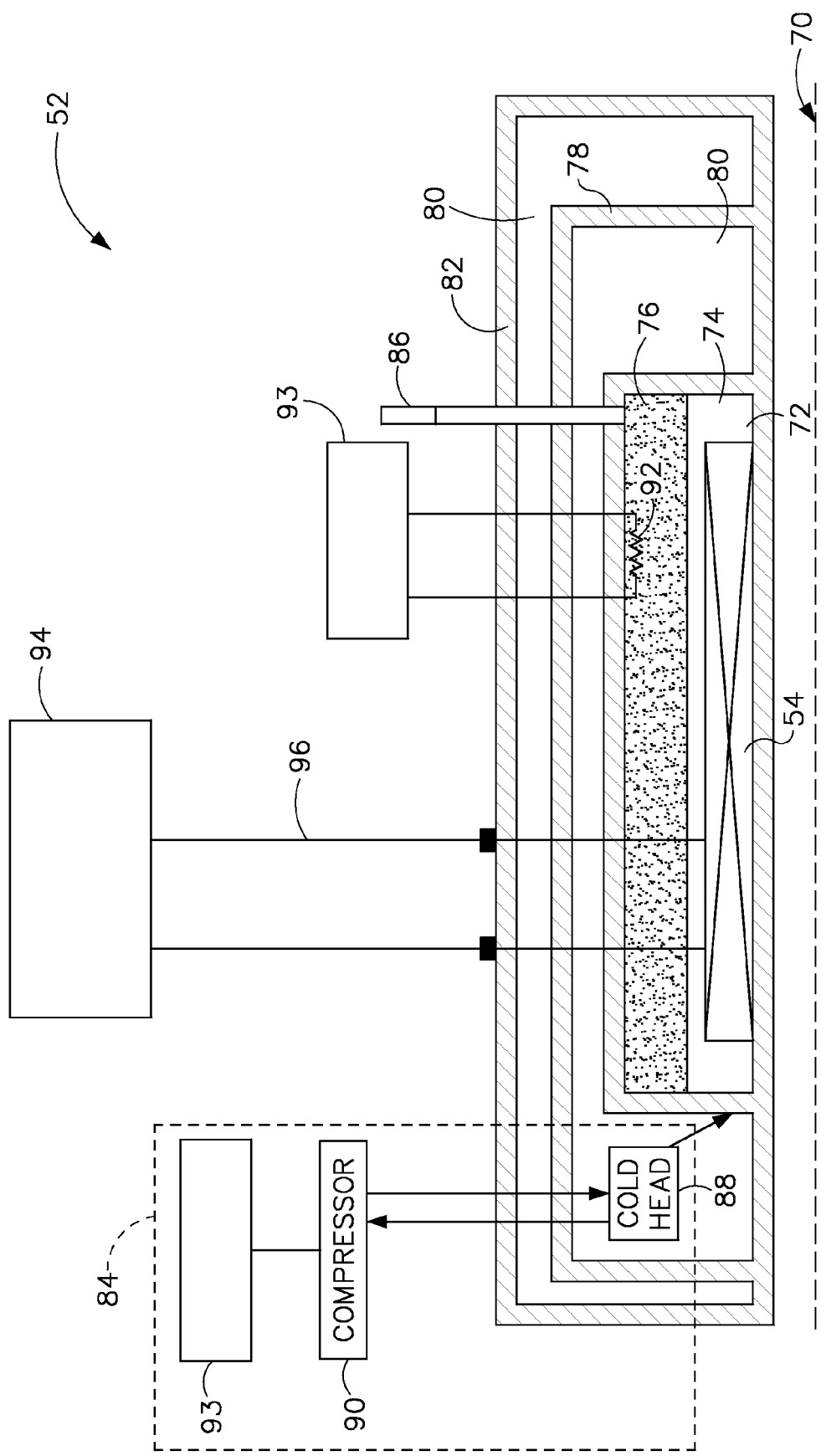
FIG. 2 is a partial cross-sectional view of an exemplary resonance assembly according to an embodiment of the invention.

Turning to FIG. 2, a partial cross-sectional view of resonance assembly 52 is presented. Only an upper portion (i.e., above the centerline) of the exemplary, tubular resonance assembly 52 is illustrated. Because of the tubular design, the lower portion is similar to the upper portion, and, as such, the lower portion is not separately discussed. Additionally, it should be noted that, although a tubular scanner structure is described here, other geometries of magnets are known and presently in use, and can benefit from aspects of the present invention. As discussed above, the polarizing magnet 54 of resonance assembly 52 maintains a main magnetic field of 3.0 Tesla. The polarizing magnet 54 is located towards the center of the resonance assembly 52 and disposed circumferentially about a patient bore 70. The polarizing magnet 54 is an electromagnet formed of loops of coiled wire (not shown), through which electrical current is routed to produce the main magnetic field. To reduce the electrical load necessary to produce the desired main magnetic field, the polarizing magnet 54 is cooled to a superconductive state.

To transition the polarizing magnet 54 to a superconductive state, the polarizing magnet 54 may be bathed in a cryogen, such as liquid helium 72, contained in a helium vessel 74, which circumscribes the patient bore 70 and surrounds the polarizing magnet 54. The liquid helium 72 cools the polarizing magnet 54 to superconductive temperatures (e.g., −269 C or 4 k). At superconductive temperatures, the polarizing magnet 54 (i.e., the loops of coiled wire) conducts electrical current essentially free of electrical resistance.

Liquid helium 72, similar to other cryogens, vaporizes into a gaseous state (i.e., gaseous helium 76) at relatively low temperatures (e.g., liquid helium boils at 4.2 K under standard pressure conditions). Accordingly, to insulate the helium 72 and 76 from external heat sources, the helium vessel 74 may be surrounded by a radiation heat shield 78. Advantageously, a vacuum region 80 located between the helium vessel 74 and the heat shield 78, as well as between the heat shield 78 and an outer housing 82 of the resonance assembly 52 may further insulate the helium vessel 74 from external heat sources.

Furthermore, as also discussed below, the vaporization of the liquid helium 72 typically increases the pressure in the helium vessel 74. Accordingly, the helium vessel 74 may be coupled to a vent or relief valve 86. In the present embodiment, for example, if pressure in the helium vessel 74 reaches or exceeds a desired operating pressure (e.g., 4 psi), the vent may release excess helium 76 to relieve the pressure. However, because helium is relatively expensive, it is desirable to avoid the venting of the helium.

To conserve helium, the helium vessel 74 is coupled to a cryogen condensing system 84, which re-condenses gaseous helium 76 back into its liquid phase 72. The cryogen condensing system 84 includes a cold head 88 coupled to a compressor 90. As appreciated by those skilled in the art, the compressor 90 pressurizes a coolant, such as liquid nitrogen, and circulates the coolant to the cold head 88. By allowing the coolant to decrease in pressure, the cold head 88 may be cooled to the condensation point temperature of the cryogen that is enough to cause the gaseous helium 76, for example, to return to its liquid phase. In a cyclical manner, the gaseous helium 76 is routed from the vessel to the cold head 88, the components of which are cooled to approximately 2-4K to condense the helium into its liquid phase 72. The re-condensed liquid helium 72 is routed back into the helium vessel 74, thereby conserving the helium in the vessel 74 and producing equilibrium between the liquid and gaseous phases of the helium.

During operation of the MRI system 10 (FIG. 1), it may be advantageous to maintain the pressure within the helium vessel 74 within predetermined parameters, e.g., 4.0 to 4.5 psi. To increase the pressure (i.e., increase the pressure to a positive pressure condition), a heating element 92, such as a resistive heating element, is located in the helium vessel 74. Control systems 93 may be employed to control operation of the heating element 92 and condensing system 84 to maintain equilibrium in the vacuum vessel 74, thereby preventing unnecessary boil-off of helium 72 and maintaining the polarizing magnet 54 in a superconducting state.

It is recognized that the resonance assembly 52 may, on occasion, require maintenance. For example, the cold head 88 may begin to lose efficacy, the RF coils 56 may require calibration, the image quality may deteriorate, or filters may require cleaning to name but a few types of service maintenance. Moreover, the helium 72 may decline to undesirable levels and/or may reach undesirable temperatures, at which the polarizing magnet 54 may lose superconductivity. Service maintenance may require de-energizing the polarizing magnet 54 and taking the MRI system 10 offline. To perform this de-energizing of the magnet, and as shown in FIG. 2, a magnet ramp-down unit 94 is provided that is connectable to the resonance assembly 52, and more particularly to polarizing magnet 54. The magnet ramp-down unit 94 includes conductive leads 96 (e.g., copper leads) that connect to the polarizing magnet 54 to draw current therefrom in a controlled manner. The magnet ramp-down unit 94 thus ramps down current in the polarizing magnet 54 over a period of time, eventually de-energizing the magnet to allow for service work to be performed on the MR system 10.

Figure 3:
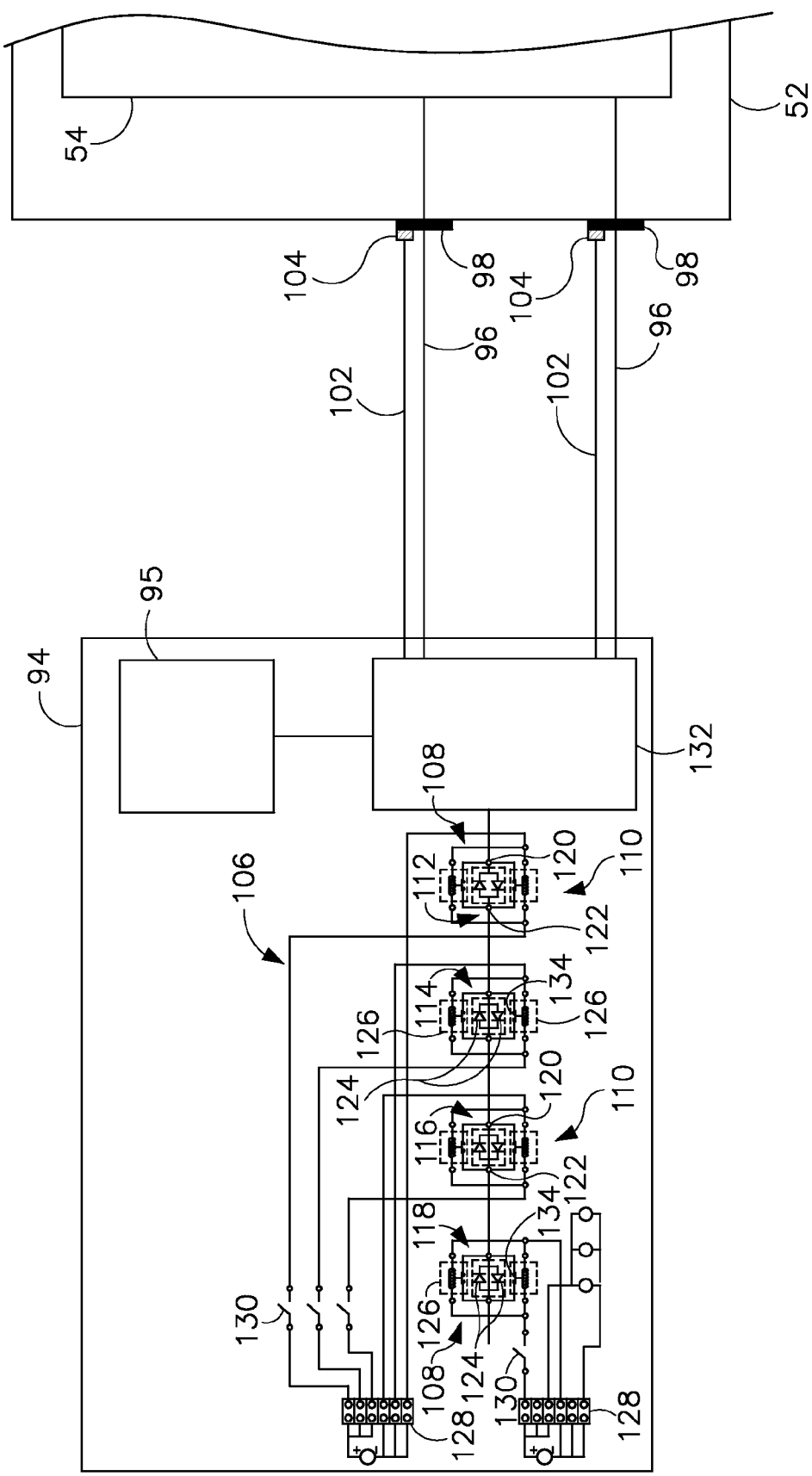
FIG. 3 is a diagrammatical representation of ramp-down unit for de-energizing a superconducting magnet system according to an embodiment of the invention.

FIG. 3 is diagrammatical representation of the magnet ramp-down unit 94. According to an embodiment of the invention, the magnet ramp-down unit 94 is incorporated into or configured as a power supply (including a power source 95) that can also be used to ramp up the polarizing magnet 54 by supplying current thereto, although it is recognized that the ramp-down unit 94 could be configured as a unit unto itself. The ramp-down unit 94 is connected to the polarizing magnet 54 via the conductive leads 96, which terminate at terminals 98 on the resonance assembly 52. Additionally, sense lines 102 run from ramp-down unit 94 to sensing devices 104 positioned in proximity to magnet (e.g., coupled to terminals 98) to provide magnet parameter data to the ramp-down unit 94. For example, the sensing devices 104 can be in the form of voltage and/or current sensors that measure the level of voltage/current in the polarizing magnet 54. As stated above, this voltage/current level or value is then transmitted to ramp-down unit 94 by sense lines 96.

As shown in FIG. 3, ramp-down unit 94 includes therein a diode and switch assembly 106 that, in operation, allows for a controlled ramp-down of current from magnet 54. Diode/switch assembly 106 includes therein a plurality of diode assemblies 108 (i.e., a diode block) arranged in series and a plurality of switches 110 arranged in parallel with the diode assemblies 108. The ramp-down unit 94 shown in FIG. 3 includes a first diode assembly 112, a second diode assembly 114, a third diode assembly 116, and a fourth diode assembly 118, but it is also recognized that a greater or lesser number of diode assemblies 108 could be included in ramp-down unit 94. Each diode assembly 108 includes a first node 120 and a second node 122 forming connection points into and out of which current is directed to flow. In an exemplary embodiment, each diode assembly 108 is comprised of a pair of parallel-connected, oppositely poled diodes 124 that operate to negate polarity related effects in the ramp-down unit 94. According to one embodiment, each of the pair of parallel-connected diodes 124 is configured as a 900 amp diode. In operation of the ramp-down unit 94, the plurality of diode assemblies 108 in diode/switch assembly 106 act as a resistance or load that draws current from the magnet, with the diode assemblies 108 being selectively engaged to increase the resistance/load in a controlled manner.

In an exemplary embodiment, the switches 110 in diode/switch assembly 106 are configured as electrical solenoid switches and each "switch" is comprised of a pair of electrical solenoid switches 126 that are arranged in parallel with each diode assembly 108. The solenoid switches 126 are normally biased to a closed position such that current flows therethrough. Each pair of solenoid switches 126 can collectively be actuated from the closed position (i.e., first position) to an open position (i.e., second position), such that a flow of current through the switch 110 can be controlled. That is, current is allowed to flow through each switch 110 when in the closed position, and current is prevented from flowing through each switch 110 when in the open position. To provide for actuation of each pair of parallelly arranged solenoid switches 126, a switching power source 128 is coupled to each switch 110 and a power source switch 130 is provided between the switching power source 128 and the switches 110 to selectively transmit power from the switching power source 128 to the switches 110. According to an exemplary embodiment, power source 128 is configured as a 12V power source sufficient to actuate switches 110. A controller 132 controls actuation of the power source switches 130 to selectively transmit power from the switching power source 128 to the switches 110, thereby also controlling the actuation of the pair of solenoid switches 126 in each switch 110. When power is transmitted from the switching power source 128 to the pair of solenoid switches 126, each of the pair of solenoid switches is actuated from the closed position to the open position by way of actuating a contact 134 from the first position to the second position (i.e., from the closed to the open position).

When a switch 110 (i.e., pair of solenoid switches 126) is in the closed position, an electrical short is formed between the first and second nodes 120, 122 of a corresponding diode assembly 108. Thus, current flows through the switch 110 and bypasses the corresponding diode assembly 108. Conversely, when a switch 110 is in the open position, current is caused to flow through the corresponding diode assembly 108. The selective actuation of switches 110 in diode/switch assembly 106 thus controls the number of diode assemblies 108 through which current from the polarizing magnet 54 passes, thereby providing for a controlled ramp-down of current from the magnet based on the selective actuation of the switches 110.

As stated above, the voltage/current values measured by sensing devices 104 are transmitted to ramp-down unit 94 by sense lines 102. More particularly, the voltage/current value of the magnet sensed by sensing devices 104 is transmitted to controller 132. The controller 132 receives the voltage/current data and controls operation of the diode/switch assembly 106 based on the received voltage/current data on the polarizing magnet 54. Upon receiving the voltage/current data, the controller 132 determines a number of the plurality of diode assemblies 108 through which current from the polarizing magnet 54 is desired to pass. Based on this determination, the controller 132 then selectively actuates the switch(es) 110 respectively coupled to those diode assemblies 108 through which current is desired to pass from the closed position to the open position, such that the current from the polarizing magnet 54 passes through the determined number of diode assemblies 108.

According to an exemplary embodiment of the invention, the controller 132, in determining a number of the plurality of diode assemblies 108 through which current from the polarizing magnet 54 is desired to pass, compares the voltage/current values received from the sensing device 104 to a plurality of pre-determined voltage/current threshold settings or values. The pre-determined voltage/current threshold settings constitute threshold settings that are tied to the selective actuation of the electrical solenoid switches 126. According to one embodiment of the invention, the plurality of threshold settings includes a threshold setting corresponding to each diode assembly 108 in the ramp-down unit 94. Thus, with respect to the ramp-down unit 94 of FIG. 3, the plurality of threshold settings could include a first threshold setting, a second threshold setting lower than the first threshold setting, a third threshold setting lower than the second threshold setting, and a final (i.e., cutoff) threshold setting lower than the third threshold setting.

According to an exemplary embodiment of the invention, the final/cutoff threshold setting defines a separation between a controlled ramp-down range and an uncontrolled ramp-down range. Based on the received voltage/current values, controller 132 is programmed to determine if the polarizing magnet 54 is in the controlled ramp-down range or the uncontrolled ramp-down range. That is, for a received voltage/current value that is greater than the final/cutoff threshold setting, the controller 132 determines that the polarizing magnet 54 is in the controlled ramp-down range. When the polarizing magnet 54 is determined to be in the controlled ramp-down range, the controller 132 further determines the number/portion of the plurality of diode assemblies 108 through which current from the polarizing magnet 54 is desired to pass based on the comparison of the received voltage/current value to the voltage/current threshold settings within the controlled ramp-down range (e.g., the first, second, and third threshold settings). For a received voltage/current value that is below the final/cutoff threshold setting, the controller 132 determines that the polarizing magnet 54 is in the uncontrolled ramp-down range and thus determines that a controlled ramp-down of the superconducting magnet is no longer needed (i.e., the current/voltage level in the polarizing magnet 54 is low enough that a magnet quenching event is no longer possible) and that, as such, current from the polarizing magnet 54 may be allowed to pass through each/all of the plurality of diode assemblies 108 to draw down the remaining current in the magnet in an efficient manner.

In operation, when the current/voltage value falls below each respective threshold setting, the controller 132 selectively actuates the switch 110 associated with that setting to the open position. Thus, the controller 132 selectively actuates the switch 110 corresponding to the first diode assembly 112 to the open position when the current/voltage value falls below the first threshold setting, selectively actuates the switch 110 corresponding to the second diode assembly 114 to the open position when the current/voltage value falls below the second threshold setting, selectively actuates the switch 110 corresponding to the third diode assembly 116 to the open position when the current/voltage value falls below the third threshold setting, and selectively actuates the switch 110 corresponding to the fourth diode assembly 118 to the open position when the current/voltage value falls below the final/cutoff threshold setting. It is also recognized that, in an embodiment where additional diode assemblies 108 (and corresponding switches) are included in the diode/switch assembly 106, the switch 110 corresponding to each of the additional diode assemblies 108 would be actuated to the open position when the current/voltage value falls below the final/cutoff threshold setting.

Beneficially, the selective actuation of the switches 110 by controller 132, based on a monitored current/voltage level of the polarizing magnet 54, provides for a controlled ramp-down of the polarizing magnet 54. The controlled ramp-down of the polarizing magnet 54 by ramp-down unit 94 thus protects against a possible magnet "quenching" that could damage the magnet were de-energizing of the magnet performed in an uncontrolled manner (e.g., current from the magnet automatically caused to pass through all diode assemblies). The controlled ramp-down of the polarizing magnet 54 by ramp-down unit 94 also helps to preserve cryogen (e.g., liquid helium 72) in condensing system 82 (FIG. 2). That is, heat is introduced to the polarizing magnet 54 during a ramp-down process due to the connection of the conductive leads 96 to the magnet, thereby causing cryogen to boil off. Therefore, lessening the time period of the ramp-down, and the time the conductive leads 96 are connected to polarizing magnet 54, reduces the amount of cryogen lost. The selective routing of the current from the polarizing magnet 54 through the diode assemblies 108 helps to minimize the time period of the ramp-down process, thereby minimizing cryogen loss.

A technical contribution for the disclosed method and apparatus is that is provides for a controller implemented system and method for ramping-down a superconducting magnet in an automated fashion for servicing.

Therefore, according to an embodiment of the invention, a superconducting magnet ramp-down unit includes an electrically conductive lead connectable to a superconducting magnet and a plurality of diode assemblies arranged in series and coupled to the electrically conductive lead, each diode assembly having a first node and a second node. The ramp-down unit also includes a plurality of switches arranged in parallel with the plurality of diode assemblies, with each switch having a first position and a second position and wherein each switch, when in the first position, forms an electrical short between the first and second nodes of a corresponding diode assembly. The ramp-down unit further includes a controller programmed to receive at least one magnet parameter value indicative of a present state of the superconducting magnet, determine a number of the plurality of diode assemblies through which current from the electrically conductive lead is desired to pass based on the at least one magnet parameter value, and selectively actuate the plurality of switches respectively coupled to the determined number of diode assemblies to the second position, such that the current from the superconducting magnet passes through the determined number of diode assemblies.

According to another embodiment of the invention, a method for automatically controlling a ramp-down of a superconducting magnet includes the step of electrically coupling a ramp-down unit to the superconducting magnet, with the ramp down unit comprising a plurality of diode assemblies and a plurality of solenoid switches arranged in parallel with the plurality of diode assemblies. The method also includes the steps of monitoring at least one magnet parameter value indicative of a current state of the superconducting magnet and determining a number of the plurality of diode assemblies through which current from the superconducting magnet is desired to pass based on the at least one magnet parameter value. The method further includes the step of selectively actuating the plurality of solenoid switches respectively coupled to the determined number of diode assemblies from a closed position to an open position based on the at least one magnet parameter value, wherein the selective actuation of the plurality of solenoid switches respectively coupled to the determined number of diode assemblies from the closed position to the open position causes current from the superconducting magnet to pass through the determined number of diode assemblies.

According to yet another embodiment of the invention, a system for automatically ramping-down a superconducting magnet includes an electrically conductive lead connectable to a superconducting magnet, a plurality of diode assemblies arranged in series and coupled to the electrically conductive lead, and a plurality of switches arranged in parallel with the plurality of diode assemblies, with each switch having a first position and a second position and wherein each switch causes current from the superconducting magnet to bypass a corresponding diode assembly when in the first position and causes current from the superconducting magnet to pass through a corresponding diode assembly when in the second position. The system also includes a controller programmed to receive at least one magnet parameter value indicative of a present state of the superconducting magnet and determine if the superconducting magnet is in a controlled ramp down range or in an uncontrolled ramp down range based on the at least one magnet parameter value. The controller is further programmed to selectively actuate a portion of the plurality of switches from the first position to the second position if the superconducting magnet is in the controlled ramp down range and actuate each of the plurality of switches from the first position to the second position if the superconducting magnet is in the uncontrolled ramp down range.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A superconducting magnet ramp-down unit comprising:
   an electrically conductive lead connectable to a superconducting magnet;
   a plurality of diode assemblies arranged in series and coupled to the electrically conductive lead, each diode assembly having a first node and a second node;
   a plurality of switches arranged in parallel with the plurality of diode assemblies, each switch having a first position and a second position, and wherein each switch, when in the first position, forms an electrical short between the first and second nodes of a corresponding diode assembly; and
   a controller programmed to:
      receive at least one magnet parameter value indicative of a present state of the superconducting magnet;
      determine a number of the plurality of diode assemblies through which current from the electrically conductive lead is desired to pass based on the at least one magnet parameter value; and
      selectively actuate the plurality of switches respectively coupled to the determined number of diode assemblies to the second position, such that the current from the superconducting magnet passes through the determined number of diode assemblies.

2. The superconducting magnet ramp-down unit of claim 1 wherein each of the plurality of diode assemblies comprises a pair of parallel-connected, oppositely poled diodes.

3. The superconducting magnet ramp-down unit of claim 2 wherein each of the pair of parallel-connected, oppositely poled diodes comprises a 900 amp diode.

4. The superconducting magnet ramp-down unit of claim 1 wherein the at least one magnet parameter value comprises one of a current value and a voltage value of the superconducting magnet.

5. The superconducting magnet ramp-down unit of claim 1 wherein the controller is programmed to:
compare the at least one magnet parameter value to a plurality of threshold settings for the at least one magnet parameter;
determine the number of the plurality of diode assemblies through which current from the electrically conductive lead is desired to pass based on a relationship of the at least one magnet parameter value to the plurality of threshold settings.

6. The superconducting magnet ramp-down unit of claim 5 wherein the plurality of threshold settings includes at least a first threshold setting, a second threshold setting lower than the first threshold setting, and a final threshold setting lower than the first and second threshold settings; and
wherein the controller is programmed to:
selectively actuate the switch corresponding to a first diode assembly to the second position if the at least one magnet parameter value is below the first threshold setting and above the second threshold setting;
selectively actuate the switch corresponding to a second diode assembly to the second position if the at least one magnet parameter value is below the second threshold setting and above the final threshold setting, such that the switches corresponding to the first and second diode assemblies are actuated to the second position; and
actuate all remaining switches to the second position if the at least one magnet parameter value is below the final threshold setting, such that the current from the superconducting magnet passes through each of the plurality of diode assemblies.

7. The superconducting magnet ramp-down unit of claim 1 wherein the plurality of switches are normally biased to the first position.

8. The superconducting magnet ramp-down unit of claim 1 wherein each of the plurality of switches comprises a pair of solenoid switches arranged in parallel with a respective diode assembly.

9. The superconducting magnet ramp-down unit of claim 1 further comprising:
a switching power source; and
a power source switch configured to selectively transmit power from the switching power source to the pair of solenoid switches;
wherein the controller selectively actuates the power source switch, thereby causing the pair of solenoid switches to actuate from the first position to the second position.

10. The superconducting magnet ramp-down unit of claim 1 further comprising a sensing device configured to acquire the at least one magnet parameter value from the superconducting magnet and transmit the at least one magnet parameter value to the controller.

11. A method for automatically controlling a ramp-down of a superconducting magnet comprising:
electrically coupling a ramp-down unit to the superconducting magnet, the ramp down unit comprising a plurality of diode assemblies and a plurality of solenoid switches arranged in parallel with the plurality of diode assemblies;
monitoring at least one magnet parameter value indicative of a current state of the superconducting magnet;
determining a number of the plurality of diode assemblies through which current from the superconducting magnet is desired to pass based on the at least one magnet parameter value; and
selectively actuating the plurality of solenoid switches respectively coupled to the determined number of diode assemblies from a closed position to an open position based on the at least one magnet parameter value;
wherein the selective actuation of the plurality of solenoid switches respectively coupled to the determined number of diode assemblies from the closed position to the open position causes current from the superconducting magnet to pass through the determined number of diode assemblies.

12. The method of claim 11 wherein selectively actuating the plurality of solenoid switches comprises:
selectively actuating the solenoid switch corresponding to a first diode assembly to the open position if the magnet parameter value is at a first setting;
selectively actuating the solenoid switch corresponding to a second diode assembly to the open position if the magnet parameter value is at a second setting, such that the solenoid switches corresponding to the first and second diode assemblies are actuated to the open position; and
selectively actuating the solenoid switches corresponding to an additional diode assemblies to the open position if the magnet parameter data is at another selected setting.

13. The method of claim 11 wherein selectively actuating the plurality of solenoid switches comprises actuating each of the plurality of solenoid switches to the open position if the magnet parameter value is below a cutoff threshold setting.

14. The method of claim 11 wherein monitoring the at least one magnet parameter value comprises monitoring one of a current value and a voltage value of the superconducting magnet.

15. The method of claim 11 wherein selectively actuating the plurality of solenoid switches comprises selectively transmitting a switching power to the solenoid switches respectively coupled to the determined number of diode assemblies to cause the solenoid switches to move from the closed position to the open position.

16. A system for automatically ramping-down a superconducting magnet comprising:
an electrically conductive lead connectable to a superconducting magnet;
a plurality of diode assemblies arranged in series and coupled to the electrically conductive lead;
a plurality of switches arranged in parallel with the plurality of diode assemblies, each switch having a first position and a second position, and wherein each switch causes current from the superconducting magnet to bypass a corresponding diode assembly when in the first position and causes current from the superconducting magnet to pass through a corresponding diode assembly when in the second position; and
a controller programmed to:

receive at least one magnet parameter value indicative of a present state of the superconducting magnet;

determine if the superconducting magnet is in a controlled ramp down range or in an uncontrolled ramp down range based on the at least one magnet parameter value;

selectively actuate a portion of the plurality of switches from the first position to the second position if the superconducting magnet is in the controlled ramp down range; and actuate each of the plurality of switches from the first position to the second position if the superconducting magnet is in the uncontrolled ramp down range.

17. The system of claim 16 wherein the controller is programmed to define a magnet parameter cutoff threshold value separating the controlled ramp down range from the uncontrolled ramp down range.

18. The system of claim 16 wherein, when the superconducting magnet is further programmed to:

determine a number of the plurality of diode assemblies through which current from the electrically conductive lead is desired to pass based on the at least one magnet parameter value; and selectively actuate the portion of the plurality of switches respectively coupled to the determined number of diode assemblies to the second position, such that the current from the superconducting magnet passes through the determined number of diode assemblies 19. The system of claim 18 wherein controller is programmed to:

define a plurality of magnet parameter threshold settings within the controlled ramp down range;

compare the at least magnet parameter value to the plurality of magnet parameter threshold settings; and determine the number of the plurality of diode assemblies through which current from the electrically conductive lead is desired to pass based on the comparison of the at least magnet parameter value to the plurality of magnet parameter threshold settings.

20. The system of claim 16 wherein each of the plurality of switches comprises a pair of solenoid switches arranged in parallel with a respective diode assembly in the plurality of diode assemblies.

21. The system of claim 16 wherein the at least one magnet parameter value comprises at least one of a current value and a voltage value of the superconducting magnet.

* * * * *